(12) United States Patent
Halbritter et al.

(10) Patent No.: US 10,637,206 B2
(45) Date of Patent: Apr. 28, 2020

(54) ASSEMBLY COMPRISING AN ELECTRIC COMPONENT

(71) Applicant: OSRAM OLED GMBH, Regensburg (DE)

(72) Inventors: Hubert Halbritter, Dietfurt (DE); Andreas Wojcik, Regensburg (DE)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/302,569

(22) PCT Filed: May 16, 2017

(86) PCT No.: PCT/EP2017/061736
§ 371 (c)(1),
(2) Date: Nov. 16, 2018

(87) PCT Pub. No.: WO2017/198668
PCT Pub. Date: Nov. 23, 2017

(65) Prior Publication Data
US 2019/0312407 A1    Oct. 10, 2019

(30) Foreign Application Priority Data
May 17, 2016    (DE) .................... 10 2016 208 431

(51) Int. Cl.
*H01S 5/042* (2006.01)
*H01S 5/022* (2006.01)
(Continued)

(52) U.S. Cl.
CPC ...... *H01S 5/0421* (2013.01); *H01L 23/49589* (2013.01); *H01L 25/167* (2013.01);
(Continued)

(58) Field of Classification Search
CPC ......... H01L 25/167; H01L 2224/48091; H01L 2224/48111; H01L 23/49589;
(Continued)

(56) References Cited

U.S. PATENT DOCUMENTS

| 5,313,095 A | 5/1994 | Tagawa et al. |
| 2004/0032888 A1 | 2/2004 | Ferstl |

(Continued)

FOREIGN PATENT DOCUMENTS

| EP | 1909324 A1 | 4/2008 |
| JP | S61-216454 A | 9/1986 |

(Continued)

OTHER PUBLICATIONS

International Search Report and Written Opinion dated Jul. 17, 2017 in International (PCT) Application No. PCT/EP2017/061736, and English translation of Search Report only (12 pages).

(Continued)

*Primary Examiner* — Tod T Van Roy
*Assistant Examiner* — Delma R. Fordé
(74) *Attorney, Agent, or Firm* — MH2 Technology Law Group, LLP

(57) ABSTRACT

The invention relates to an assembly comprising an electric component. The component has an electric part, a control circuit, and a capacitor. At least two lead frames are provided which are embedded into a housing. The part, the control circuit, and the capacitor are arranged on the lead frames, and the control circuit is designed to charge the capacitor and to supply the part with current from the capacitor in a clocked manner. The component has two contacts, and the component is arranged on a support. The support has an electrically conductive layer and the two contacts are connected to the layer in an electrically conductive manner. At least one first part of one lead frame is arranged at a greater (Continued)

distance from the electrically conductive layer than the second lead frame.

13 Claims, 5 Drawing Sheets

(51) Int. Cl.
*H01L 23/495* (2006.01)
*H01L 25/16* (2006.01)
*H01L 33/62* (2010.01)

(52) U.S. Cl.
CPC ...... *H01S 5/02216* (2013.01); *H01S 5/02244* (2013.01); *H01S 5/02276* (2013.01); *H01S 5/0425* (2013.01); *H01S 5/04256* (2019.08); *H01L 33/62* (2013.01); *H01L 2224/48091* (2013.01); *H01L 2224/48111* (2013.01); *H01S 5/0427* (2013.01)

(58) Field of Classification Search
CPC ............. H01L 23/49541; H01L 23/498; H01L 23/49537; H01L 23/49575; H01L 23/52; H01L 23/495–49596; H01L 33/62; H01L 21/4821; H01S 5/0421; H01S 5/02216; H01S 5/02244; H01S 5/02276; H01S 5/04256; H01S 5/0425; H01S 5/0427; H01S 5/02248
See application file for complete search history.

(56) References Cited

U.S. PATENT DOCUMENTS

| | | | | |
|---|---|---|---|---|
| 2005/0111503 | A1* | 5/2005 | Ishigami | H01S 5/02212 372/38.1 |
| 2008/0036034 | A1* | 2/2008 | Juskey | H01L 23/3107 257/531 |
| 2013/0015566 | A1* | 1/2013 | Gong | H01L 23/49537 257/676 |
| 2014/0307755 | A1* | 10/2014 | Wojcik | H01S 5/02228 372/38.02 |
| 2015/0014845 | A1 | 1/2015 | Meyer-Berg et al. | |
| 2015/0214129 | A1 | 7/2015 | Kawakita et al. | |
| 2016/0262230 | A1* | 9/2016 | Park | H01L 24/73 |
| 2018/0040540 | A1* | 2/2018 | Kasuya | H02P 6/14 |
| 2018/0254605 | A1* | 9/2018 | Wojcik | H01S 5/02216 |

FOREIGN PATENT DOCUMENTS

| | | | |
|---|---|---|---|
| JP | S62-241383 A | 10/1987 | |
| JP | H09232637 | * 9/1997 | ............ H01L 23/48 |
| JP | H10-74886 A | 3/1998 | |
| JP | H11-251508 A | 9/1999 | |
| JP | 2000-150763 A | 5/2000 | |
| JP | 3571450 B2 | 9/2004 | |
| JP | 2006-190850 A | 7/2006 | |
| JP | 2006-324670 A | 11/2006 | |
| JP | 2014-531132 A | 11/2014 | |
| WO | 2007/037190 A1 | 4/2007 | |
| WO | 2012/120568 A1 | 9/2012 | |
| WO | 2013056967 A2 | 4/2013 | |
| WO | 2014/097641 A1 | 6/2014 | |

OTHER PUBLICATIONS

Notice of Reason for Rejection received in Japanese patent application No. 2018-550572 dated Sep. 10, 2019.

* cited by examiner

A)

C)

B)

D)

E)

F)

ASSEMBLY COMPRISING AN ELECTRIC COMPONENT

RELATED APPLICATIONS

This application is a United States National Phase under 35 U.S.C. § 371 of International Application No. PCT/EP2017/061736, filed on May 16, 2017, which claims priority to German Patent Application No. 102016208431.3, filed May 17, 2016, both of which are hereby incorporated by reference in their entirety for all purposes.

The invention relates to an arrangement having an electrical device according to claim 1 and to a method according to claim 9.

In the prior art arrangements having an electrical device, which is arranged on a carrier, are known.

The object of the invention is to provide an arrangement having an electrical device which has improved electrical properties.

The object of the invention is achieved by the arrangement according to claim 1 and by the method according to claim 9.

Further developments of the invention are described in the dependent claims.

According to at least one embodiment, the electrical device comprises an electrical component. The component is preferably a semiconductor component which is designed to generate radiation. In particular, the component is a light-emitting diode, LED for short, or a laser diode, abbreviated to LD. For example, the component is designed to emit radiation having a wavelength of maximum intensity of at least 360 nm or 410 nm or 760 nm and/or of at most 1300 nm or 1050 nm or 570 nm. In particular, the component is designed to generate visible light or near-infrared radiation.

According to at least one embodiment, the device comprises one or more control circuits. The at least one control circuit is configured for pulsed operation of the component. A pulse duration which can be achieved overall by the control circuit and by the component, is preferably at least 0.5 ns or 2 ns and/or at most 15 ns or 10 ns or 8 ns. In particular, the pulse duration is at least 3 ns and/or at most 6 ns. The pulse duration is understood to mean in particular the full width at half the height of the maximum in the time domain, FWHM for short.

According to at least one embodiment, the device comprises one or more capacitors. The at least one capacitor is electrically connected in series with the associated component and is configured for pulsed energization of the component. A capacitance of the capacitor is, for example, at least 10 nF or 30 nF and/or at most 1 µF or 0.5 µF. In particular, the capacitance is 100 nF. If a plurality of components are present for generating radiation, a separate capacitor can be assigned to each component. In order to reduce inductances, it is possible for a plurality of capacitors connected electrically in parallel to be present, also per component.

According to at least one embodiment, the device comprises a lead frame assembly. The lead frame assembly comprises a plurality of lead frames which are different from one another. The lead frames are produced, for example, by means of cutting, etching and/or punching from a semi-finished product of the lead frame assembly. The individual lead frames are not connected to one another in one piece by a common, in particular metallic material. The lead frame is produced in particular from a copper sheet or a silver sheet, wherein coatings can be present, for example, for increasing a reflectivity or for improving a solderability. A thickness or an average thickness of the individual lead frames is preferably at least 50 µm or 100 µm or 200 µm and/or at most 1 mm or 0.5 mm.

According to at least one embodiment, the lead frame assembly is thinned in places from a mounting side of the component. This means that, from the mounting side, material removal relative to the original lead frame has been done and/or the lead frame assembly lies only partially in the mounting side.

In this way, the lead frame assembly is not to be electrically and/or mechanically contacted over its entire surface.

According to at least one embodiment, the device can be surface-mountable. This means that the device can be fastened by means of surface mount technology or SMT for short. In particular, the device is a QFN device, wherein QFN stands for Quad Flat No lead.

In at least one embodiment, the surface-mountable electrical device comprises at least one electrical component for generating radiation, a control circuit for pulsed operation of the component and a capacitor for energizing the component. The carrier for the aforementioned elements is a lead frame assembly having a plurality of different lead frames which are separate elements. The lead frame assembly is thinned in places from a mounting side of the device so that the lead frame assembly lies only partially in the mounting side.

In particular QFN housings for short high-current pulses, especially for operating semiconductor lasers having a capacitor and a control circuit such as a field-effect transistor or a user-specific integrated circuit, ASIC for short, in a housing, preferably have low inductance values in an electrical discharge path. This is difficult to realize with electrically single-layer housing concepts and/or printed circuit boards.

One possibility for implementing are so-called microstrip lines. In single-layer housing concepts such as QFN components, an adaptation to a printed circuit board is therefore to be ensured so that the housing, together with the circuit board, forms at least one microstrip line. This is possible in particular by means of a targeted deep etching of the lead frame assembly and of individual lead frames, also referred to as conductor frames. In this way, a low overall inductance can be achieved and, in addition, it is possible to dispense with multi-layer printed circuit boards, which are to be provided by the user and/or handler of the electrical device. For example, a reduction of the number of layers by approximately 50% can be achieved, compared to the use of conventional devices instead of the device described here.

According to at least one embodiment, the component is applied to a first lead frame. For example, the component is connected with a cathode electrically directly and areally to the first lead frame.

According to at least one embodiment, the capacitor is applied to a second lead frame by means of a first connection. As also for all other components, the application preferably takes place by means of soldering or electrically conductive adhesive bonding.

According to at least one embodiment, the control circuit and the capacitor are applied to a third lead frame by means of a second connection. It is possible for the third lead frame to be larger than the second lead frame, which in turn can be larger than the first lead frame.

According to at least one embodiment, the control circuit is electrically connected directly to one or to a plurality of contact surfaces, wherein the contact surfaces are preferably formed by a respective lead frame. Electrically directly connected in particular means that no or no significant electrical resistance or no other active electrical components such as diodes or transistors or capacitors or coils are mounted in the current path. No significant electrical resistance can mean less than 2Ω or 0.5Ω.

According to at least one embodiment, the component is directly electrically connected to the second lead frame and to the control circuit.

An electrically direct connection can be realized, for example, by means of soldering or electrically conductive adhesive bonding. An electrical direct connection can also be realized by means of one or more bonding wires or one or more conductor tracks. If there are a plurality of bonding wires and/or conductor tracks for the direct electrical connection, they can thus be electrically connected in parallel in order to achieve a low inductance at high currents.

The described device allows low inductances to be achieved, in particular in the case of high-current pulses, for example in the order of 30 A over 1 ns. The carrier to be provided by the user, such as a printed circuit board or PCB for short, can be designed as a single-layer or two-layer board, so that fewer layers are required in comparison with conventional devices. This makes it possible to achieve a cost saving as well as a power increase and short pulses with particularly high currents can be applied.

According to at least one embodiment, the second lead frame is designed as an external electrical contact point for a supply voltage. The supply voltage is, for example, at least 10 V or 15 V and/or at most 30 V or 20 V.

According to at least one embodiment, the third lead frame is designed as an external electrical contact point for a ground contact, also referred to as ground or GND. Alternatively, it is possible for the second lead frame to be in the form of a ground contact and the third lead frame serves as a contact for the supply voltage.

According to at least one embodiment, one of the contact surfaces, which is electrically directly connected to the control circuit, is designed as an external electrical contact point for a control voltage. The control circuit can be switched to electrically conductive via the control voltage, also referred to as a trigger. This means that the device is controlled via the control voltage. In particular, the component emits only radiation when the control voltage is applied.

According to at least one embodiment, during operation of the component, a current flows from the capacitor via the second lead frame to the component and from there to the first lead frame and from there to the third lead frame. A connection between the lead frames is in particular realized in each case by a plurality of parallel bonding wires.

According to at least one embodiment, the second and the third lead frame are L-shaped when viewed in plan view. Thus, the second lead frame is preferably located within a rectangle spanned by the third lead frame.

According to at least one embodiment, the device comprises a housing. The housing is preferably made of one or more plastics. The individual lead frames of the lead frame assembly are mechanically connected to one another by means of the housing. The component is mechanically stabilized via the housing. It is possible for a material of the housing to partially form the mounting side. The mounting side can consist of the lead frames and the housing material.

According to at least one embodiment of the device, the third lead frame is the largest lead frame. The size of the second lead frame can lie between the sizes of the first and third lead frames. This applies, in particular, in a plan view.

According to at least one embodiment, the first and/or the third lead frame are T-shaped when viewed in plan view. In this case, middle parts of the two T's can point towards each other. The middle part is in this case the centrally located part projecting from a continuous upper part. The middle parts are preferably shorter than the upper parts.

According to at least one embodiment, the second lead frame, viewed in a plan view, lies between the first and the third lead frame. The second lead frame preferably lies on a side of the two middle parts of the T's.

The invention further relates to an arrangement. The arrangement preferably comprises one or more devices as indicated in connection with one or more of the above-mentioned embodiments. Features for the device are therefore also disclosed for the arrangement and vice versa.

In at least one embodiment, the arrangement comprises a carrier, on the top side of which the at least one device is applied. On the top side, there is a contact layer with one or, preferably, a plurality of contact points for electrically and mechanically contacting the device. At least some of the lead frames are electrically and mechanically connected to the contact points, wherein this does not have to apply to all the lead frames of the device. The lead frames are partially spaced apart from the top side of the carrier.

According to at least one embodiment, a first region of the third lead frame, on which the control circuit and the capacitor with the second connection are applied, is electrically directly connected to a second region of the third lead frame via the contact layer. These two regions of the third lead frame are preferably spatially separated from one another and are located in particular on opposite, most distant regions of the lead frame. The two regions can be separated from one another exclusively with regard to their electrical function, so that no real, physical boundary between the regions needs to exist.

According to at least one embodiment, during operation of the component, both connections of the capacitor are electrically connected to one another via the component, the control circuit and the contact layer. As a result, it is possible that an inductance for a discharge current of the capacitor is reduced and a part of the discharge current flows through the contact layer of the carrier. The discharge current through the contact layer preferably runs congruently or approximately congruently with the current flow through the component.

In other words, a type of mirror current to the discharge current through the component in the device can be realized in the contact layer of the carrier. As a result, magnetic fields occurring due to the currents can be at least partially compensated so that overall an inductance is effectively reduced. In this way, shorter switching times and/or larger discharge currents can be realized.

According to at least one embodiment of the arrangement, during operation of the component both connections of the capacitor are electrically connected to one another via the component, the control circuit and the third lead frame. This means that a part of the discharge current also flows within the device. Said discharge path within the device is electrically connected in parallel to the discharge path via the contact layer. Here and otherwise, "discharge current" means in particular that a side of the capacitor facing away from the component is supplied with current during discharging.

According to at least one embodiment, the contact layer, which connects the first and second regions to one another, runs completely and preferably directly on the top side of the carrier. The contact layer can be designed to be flat. In particular, the contact layer extends over the whole area under the first lead frame, but electrically insulated there-from. For this purpose, the first lead frame is preferably spaced apart from the mounting side. This can be achieved by a whole-area thinning of the first lead frame. Alternatively, the contact layer can lie within or on an underside of the carrier or can be realized by a plurality of layers in the carrier.

According to at least one embodiment, the second lead frame, viewed in a plan view, lies in parts over the contact layer. Due to the point-wise thinning of the second lead frame, the latter is spaced apart from the contact layer in the regions mentioned. This design of the second lead frame makes it possible that the discharge current in the contact layer is congruent or approximately congruent with the current across the component, viewed in a plan view. At the same time, the second lead frame can be electrically contacted via another contact point of the contact layer of the carrier.

According to at least one embodiment, a distance between the contact layer and the first lead frame on which the component is located is at most 1.5 mm or 1 mm or 0.5 mm. Alternatively or additionally, this distance is at least 0.1 mm or 0.2 mm. This distance ensures, on the one hand, a short-circuit safety, on the other hand low effective inductances can be achieved due to the compensation of the discharge current in the contact layer of the carrier and of the discharge current through the component.

The invention further relates to an arrangement comprising an electrical device wherein the device has an electronic component, a control circuit and a capacitor, wherein at least two lead frames are provided, wherein the lead frames are embedded in a housing, and wherein the component, the control circuit and the capacitor are arranged on the lead frame, wherein the control circuit is configured to charge the capacitor, wherein the control circuit is configured to supply the component in a clocked manner with current from the capacitor, wherein the device has two contacts, wherein the device is arranged on a carrier, wherein the carrier has an electrically conductive layer, wherein the two contacts are electrically conductively connected to the layer, wherein at least a first part of a lead frame has a greater distance from the electrically conductive layer than a second part of the lead frame. A better electrical insulation is achieved by the greater distance between at least a part of the first lead frame and the electrically conductive layer.

In one embodiment, the first lead frame has a greater distance from the layer than the second and/or further lead frame. As a result, a further improved electrical insulation of the entire first lead frame is made possible.

In one embodiment, upper sides of the lead frames are arranged at the same height. As a result, a simple construction is made possible. Due to the thinner design of at least the part of the first lead frame, the thickness of the part of the first lead frame can lie in a range of 90% to 50% or less of the thickness of the rest of the first lead frame.

In one embodiment, three lead frames are provided, wherein the component is electrically conductively connected to the first lead frame by means of a first connection, wherein the component is connected to the second lead frame by means of a second connection, wherein the capacitor is electrically conductively connected to the second lead frame by means of a first connection, wherein the capacitor is connected to the third lead frame by means of a second connection, wherein the control circuit is connected to the first lead frame by means of a first connection, wherein the control circuit is connected to the second lead frame by means of a second connection, wherein the control circuit is connected to the third lead frame by means of a third connection, and wherein the two contacts are connected to the third lead frame. A compact structure is thus obtained.

In one embodiment, the component is arranged on the first lead frame, wherein the capacitor is arranged on the second and third lead frames, and wherein the control circuit is arranged on the third lead frame.

In one embodiment, an insulating layer is introduced into the carrier between the part of the lead frame which is further away from the layer and the carrier. As a result, a further improvement of the electrical insulation is achieved.

In one embodiment, a second electrically conductive layer is arranged in the carrier, wherein the second layer is electrically conductively connected to the first layer, and wherein the first and the second layers are arranged parallel to one another. As a result, the electrical resistance for the return flow in the carrier is reduced.

In one embodiment, the component is configured as a light-emitting component. The compact structure described is advantageous in particular in the case of light-emitting properties.

The invention further relates to a method for producing such a device and/or such an arrangement. Features of the method are therefore also disclosed for the device and the arrangement and vice versa.

Thus, a method for producing an arrangement is proposed, wherein a first and at least one further lead frame are provided, wherein at least a part of the first lead frame is formed thinner from a bottom side than the further lead frame, wherein the lead frames are embedded in a material, in particular in a molding material, wherein a capacitor, a component and a control circuit are mounted on the lead frames and a device is obtained, wherein a carrier having an electrically conductive layer is provided, wherein the device is mounted on the carrier with a device underside, wherein the further lead frame is electrically conductively connected to the layer via two contacts.

The thinner formation of at least the part of the first lead frame is effected in particular by etching the first lead frame from the underside. Due to the thinner design of at least the part of the first lead frame, the thickness of the part of the first lead frame can lie in a range of 90% to 50% or less of the thickness of the rest of the first lead frame.

According to at least one embodiment of the method, at least a part of the first lead frame is formed thinner from the underside by means of deep etching. The same applies to the second lead frame and can also apply to the third lead frame with regard to small surface portions.

According to at least one embodiment, the entire first lead frame is formed thinner than the further lead frame.

The above-described properties, features and advantages of this invention, and the manner in which they are achieved, become clearer and more precisely understandable in connection with the following description of the exemplary embodiments, which are explained in more detail in connection with the drawings. In the Figures.

Figure 1:
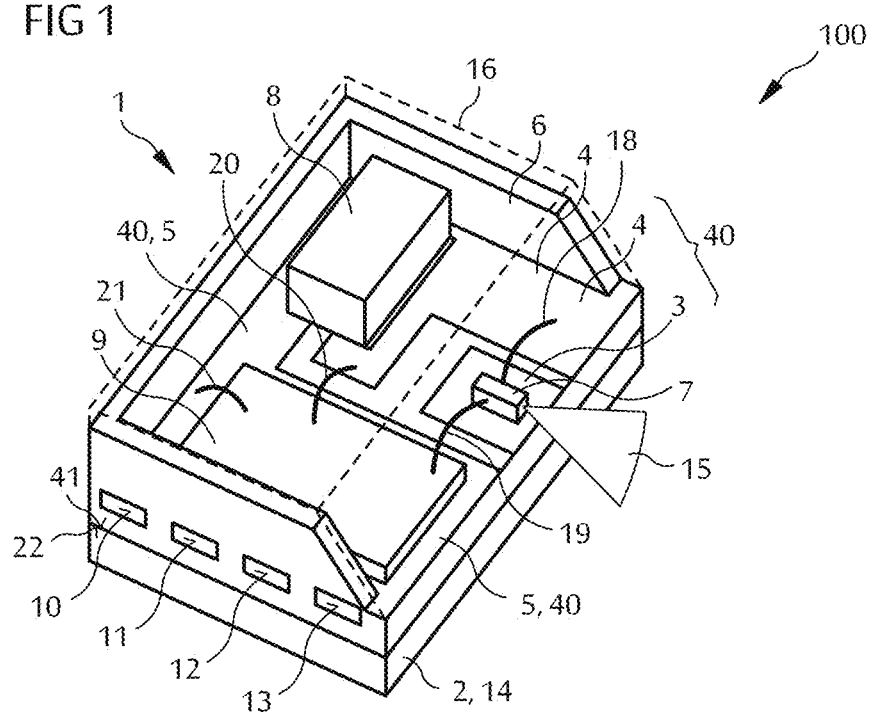
FIG. 1 shows a perspective illustration of the arrangement.
Figure 3:
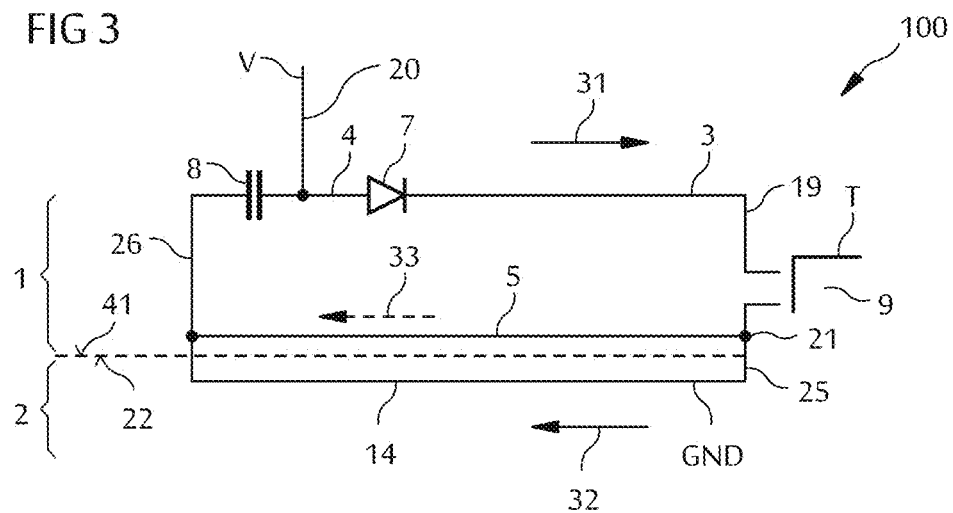
Figure 4:
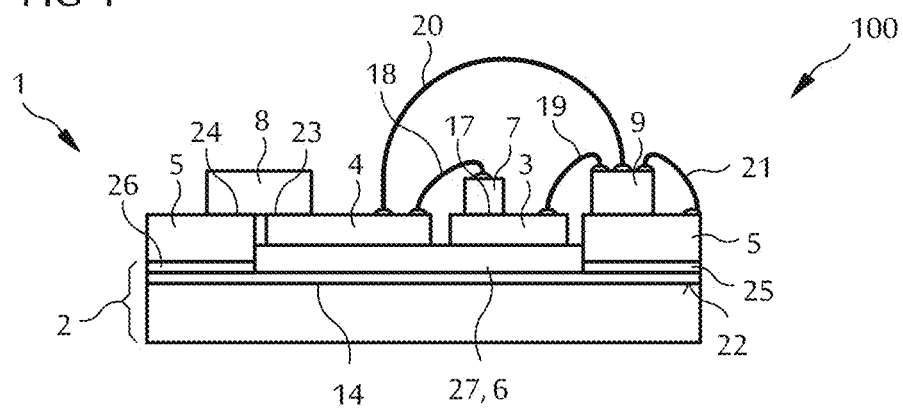
Figure 5:
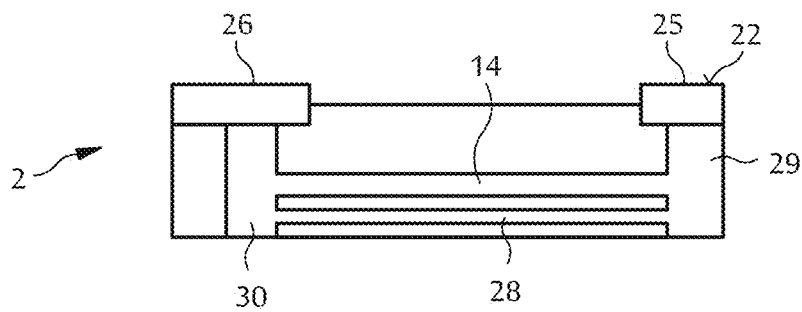
Figure 6:
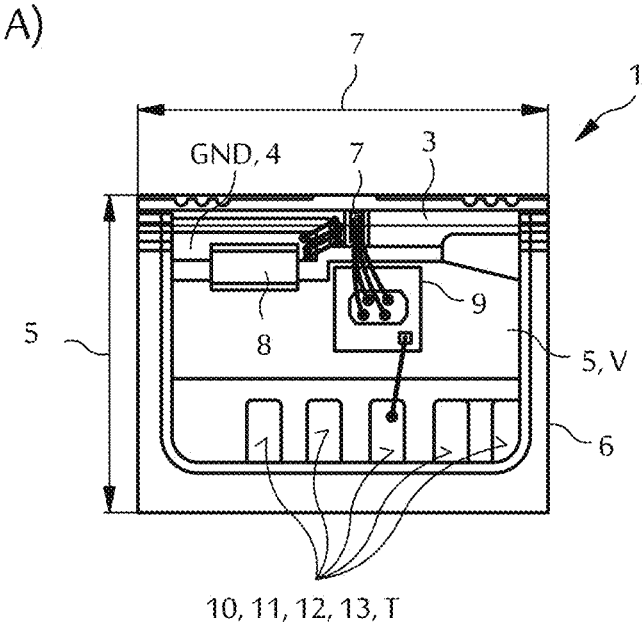
Figure 6:
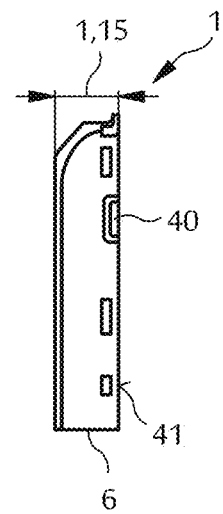
Figure 6:
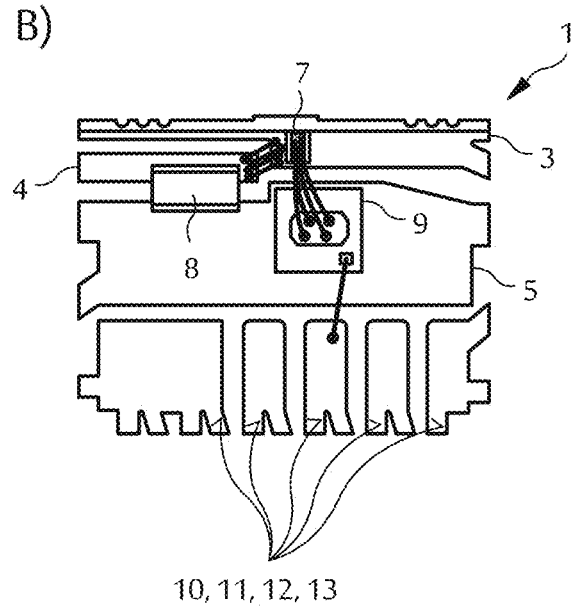
Figure 6:
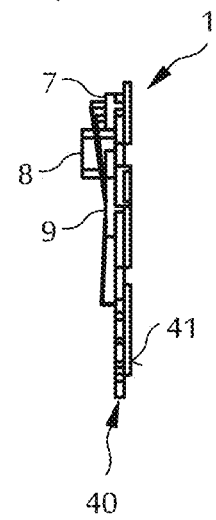
Figure 6:
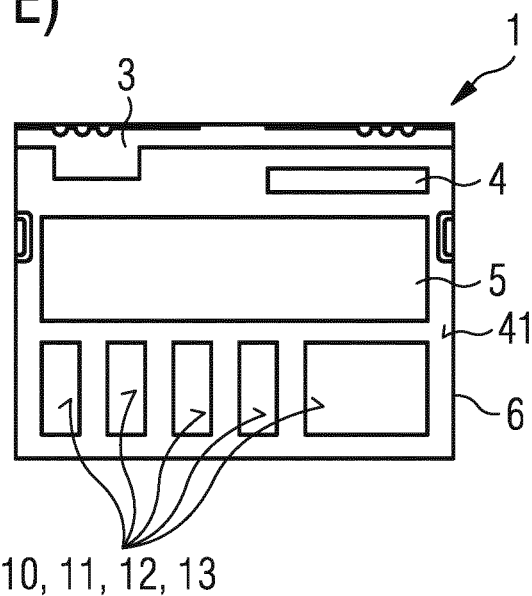
Figure 6:
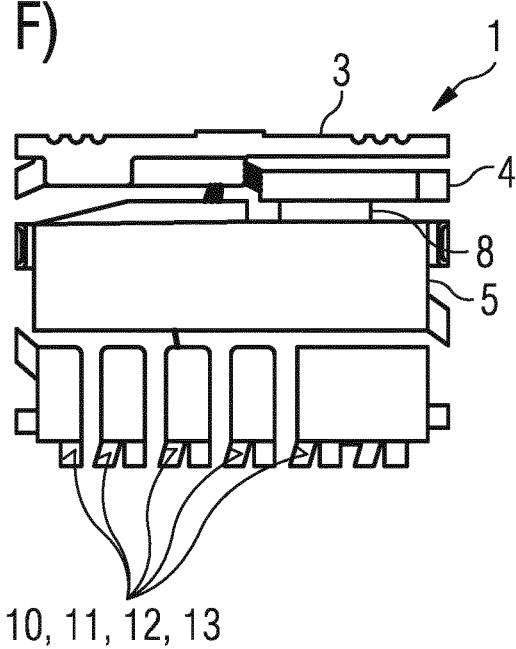
Figure 7:
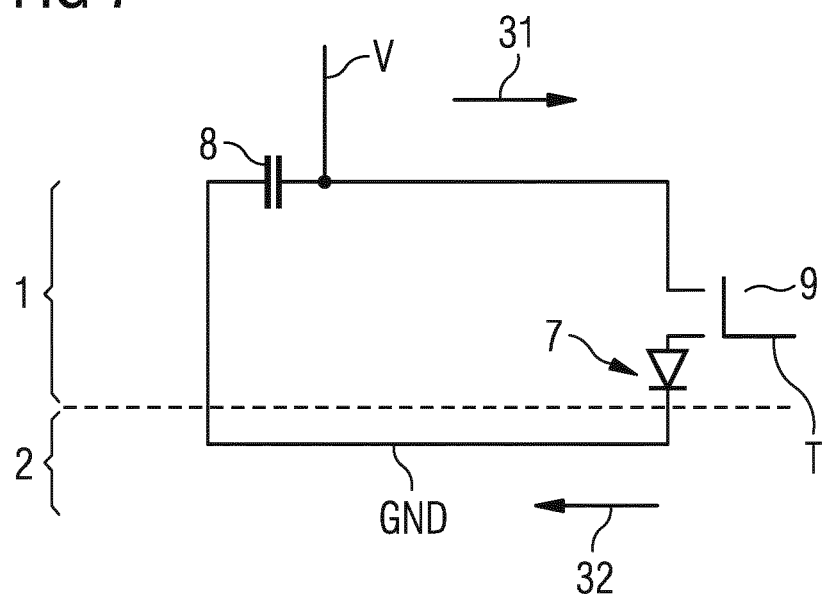

FIG. 3 shows a schematic illustration of an electrical equivalent circuit of the arrangement, FIG. 4 shows a schematic cross section through the arrangement of FIG. 1, FIG. 5 shows a schematic cross section through a further embodiment of a carrier, FIG. 6 shows a further exemplary embodiment of a device described here, and FIG. 7 shows a further schematic illustration of an electrical equivalent circuit of the arrangement.

FIG. 1 shows a perspective view of an arrangement having an electrical device 1 which is arranged on a carrier top side 22 of a carrier 2. In the exemplary embodiment illustrated, the device 1 has three lead frames 3, 4, 5. The three lead frames 3, 4, 5 are spaced apart from one another and are embedded in an electrically insulating housing 6 and are mechanically connected to one another by the housing 6. The device 1 is thus a QFN device. A mounting side 41 of the surface-mountable device 1 preferably consists of the lead frames 3, 4, 5, 10, 11, 12, 13 and of the housing 6.

Arranged on the first lead frame 3 is an electrical component 7, in particular a laser diode that can be operated in a pulsed manner. In addition, a capacitor 8 is provided, which is partially arranged on the second and on the third lead frames 4, 5. Furthermore, a control circuit 9 is provided which is arranged on the third lead frame 5. In addition, four contact surfaces 10, 11, 12, 13 are embedded in the housing 6, wherein the contact surfaces 10, 11, 12, 13 are likewise realized in the form of lead frames. The carrier 2 has an electrically conductive layer 14 (not shown in FIG. 1) which is divided into a plurality of contact points in order to contact at least a part of the lead frames 3, 4, 5, 10, 11, 12, 13 electrically and mechanically. The lead frames 3, 4, 5, 10, 11, 12, 13 form a lead frame assembly 40.

The component 7 can, for example, be in the form of an electrical component such as, for example, a transistor, in the form of an electric circuit and/or in the form of a light-emitting component. In the exemplary embodiment illustrated, the component is in the form of a light-emitting component, in particular in the form of a laser or a laser diode, which radiates light in a lateral emission direction 15. The component 7, the capacitor 8 and the control circuit 9 are preferably covered with an insulation layer 16. The insulation layer 16 can be transparent and transmissive to the radiation generated during operation.

Figure 2:
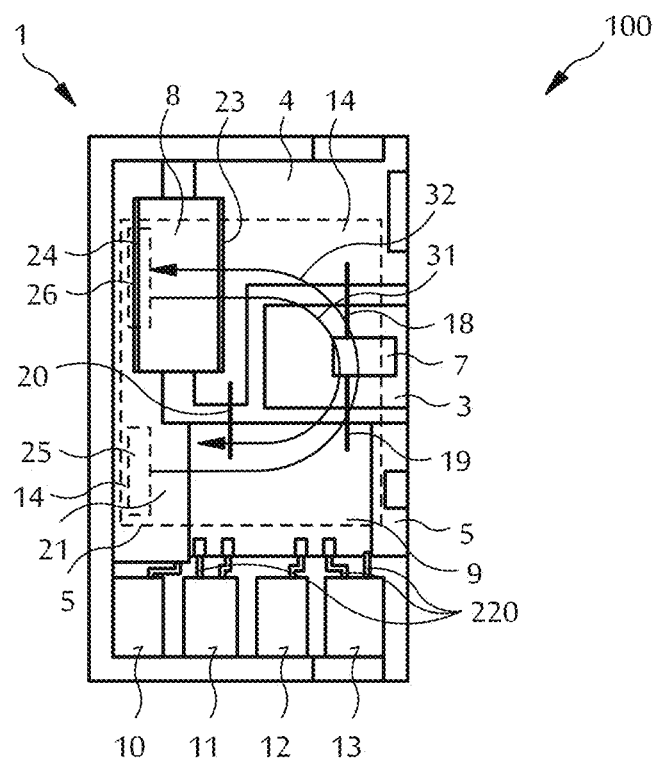
FIG. 2 shows a plan view of the arrangement of FIG. 1.

FIG. 2 shows a schematic representation of a view from above of the arrangement of FIG. 1. The component 7 is electrically conductively connected to the first lead frame 3 by means of a first connection 17, as shown in cross section view of FIG. 4. In addition, the component 7 is electrically conductively connected to the second lead frame 3 by means of a second connection 18. The first connection 17 can be formed, for example, of contacts on the underside of the component 7. The second connection 18 can be designed in the form of bonding wires. In a departure from the illustration in FIGS. 1 and 2, a plurality of parallel-connected bonding wires are preferably present, four electrically parallel bonding wires, for example, in order to be able to realize shorter switching times.

As in all other exemplary embodiments, it is also possible that the component 7 is not arranged on a separate lead frame 3, but is located on the second lead frame 4 together with the first connection 23 of the capacitor 8, or alternatively also on the third lead frame 5 together with the second connection 24.

The control circuit 9 is electrically conductively connected with its first connection 19 to the first lead frame 3, for example by means of bonding wires. In addition, the control circuit 9 is electrically conductively connected with its second connection 20 to the second lead frame 4, for example by means of bonding wires. A short-circuit current or a precharge of the capacitor 8 and/or of the component 7 can be effected via the second connection 20. If the control circuit 9 is an IC or ASIC, and not just a transistor such as a FET, in addition a control of the voltage applied to the second lead frame 4 can also take place via the second connection 20. It is thus possible in particular for error signals to be output via the control circuit 9, for example via the contact surfaces 10, 12, 13. One of the contact surfaces 11 is provided for a trigger signal T for switching the component 7, the other contact surfaces 10, 12, 13 can be functionalized for additional signals.

Furthermore, the control circuit 9 is electrically conductively connected to the third lead frame 5 via a third connection 21, for example in the form of bonding wires. In addition, the control circuit 9 is electrically conductively connected to the contact surfaces 10, 11, 12, 13 via further connections 220.

The capacitor is electrically conductively connected with its first connection 23 to the second lead frame 4. In addition, with its second electrical connection 24 the capacitor 8 is electrically conductively connected to the third lead frame 5. The first and the second connections 23, 24 of the capacitor 8 can be designed, for example, in the form of bonding wires or in the form of contacts on the underside of the capacitor 8.

In addition, the third lead frame 5 is electrically conductively connected via two contacts 25, 26, which are drawn in dashed lines, to the electrically conductive layer 14 of the carrier 2. A first region 25 is arranged in FIG. 2 on a lefthand side next to the control circuit 9. A second region 26 is arranged near the capacitor 9. The layer 14 is likewise drawn in dashed lines. The layer 14 can have a flat, in particular rectangular shape. The layer 14 can extend over a large part of the surface of the carrier 2.

In addition, the layer 14 is structured into contact points for the lead frames 4, 10, 11, 12, 13, not shown. In this case, the first lead frame 3 is spaced apart from the layer 14 and is not directly contacted with the latter. The second lead frame 4 is only partially in contact with one of the contact points of the layer 14, seen in plan view, so that no short circuit occurs with the third lead frame 5.

The control circuit 9 is connected via the carrier 2 to a current source (not illustrated) and is configured in order to charge the capacitor 8 via the second and third connections 20, 21. In addition, the control circuit 9 is designed to electrically conductively connect the component 7 to the capacitor 8 via the layer 14 by means of the first and third connections 19, 21. Thus, current flows from the first connection 23 of the capacitor 8 via the second lead frame 4, the component 7, the first lead frame 3, the first connection 19 of the control circuit 9 and the third connection 21 of the control circuit 9 via the first contact 25 into the electrically conductive layer 14 of the carrier 2. Proceeding from the first contact 25, the current flows in the layer 14 back to the second contact 26 to the second connection 24 of the capacitor 8.

Between the capacitor 8, the component 7 and the control circuit 9, the current flows above the carrier 2 in the direction represented by a first arrow 31, within the device 1. The inductive return flow of the current, that is to say the discharge path, takes place on the basis of the inductive resistance in the layer 14 in a similar way, which is indicated with the aid of a second arrow 32. The preferably flat layer 14 thus enables an electrical return of the current with a low inductance. As a result, for example, short current pulses of 30 A can be transmitted with a time duration of 1 ns.

Such devices 1 which can generate short radiation pulses can be used, for example, for distance measurements, also referred to as time-of-flight applications or ToF applications.

Depending on the selected design, the layer 14 could also be formed in a U-shaped manner with two limbs and a transverse connection, wherein the contacts 25, 26 are arranged in the end regions of the limbs and the transverse connection is arranged in the region of the component 7. The U-shape is aligned in accordance with the second arrow 32, since the inductive current flow in the second layer 14 is effected via this path.

FIG. 3 shows a schematic illustration of an electrical equivalent circuit diagram of the current flow during operation of the component 7, which is designed, for example, as a laser diode.

A supply voltage V is applied to the second connection 20 of the control circuit 9. Furthermore, the control circuit 9 is connected to a control voltage T, via which a switching element in the control circuit 9, such as a field-effect transistor, FET for short, can be opened and closed. The third lead frame 5 is connected to a ground contact GND via the corresponding contact point of the layer 14.

If the switching element is open, so that no current flows via the switching element, the capacitor 8 will be charged. In this way, none of the currents 31, 32 then flows.

If the switching element is closed, the capacitor is discharged in one short current pulse via the component 7 and the switching element 9 towards the ground contact GND, so that the first discharge current 31 flows within the device 1. Since an electric charge flows away from a side of the capacitor 8 that is electrically facing the component 7, in order to compensate for an electrical charge at the same time an electrical charge has to flow to the side of the capacitor 8 which is electrically remote from the component 7. This takes place by means of the second discharge current 32. The second discharge current 32 runs in a design-dependent manner, in particular predominantly in the layer 14 of the carrier 2, and runs, as illustrated in connection with FIG. 2 in a plan view, preferably approximately congruent with the first discharge current 31, only in the opposite direction. Due to this counter-current flow, a lower effective inductance can be achieved.

In addition to the current flow 32 through the layer 14, a current flow 33 can also take place directly in the third lead frame 5. This means that the currents 32, 33 can be parallel, as a result of which the effective inductance can be further reduced. In addition, as a result of the connection via the third lead frame 5, the device 1 can also be operated without the carrier 2, in particular for test purposes and/or for production control.

FIG. 4 shows a schematic illustration of a cross section through the arrangement of FIG. 1, wherein not all contact points of the layer 14 and also not all the lead frames 3, 4, 5, 10, 11, 12, 13 are shown. In this embodiment, the electrically conductive layer 14 is arranged directly on the top side of the carrier 2. The third lead frame 5 is electrically conductively connected to the layer 14 via the contacts 25, 26. The first and the second lead frames 3, 4 have a smaller thickness at least in places than the third lead frame 5. The thickness of the first and of the second lead frames 3, 4 can lie in the range of 90% to 50% or less of the thickness of the third lead frame 5.

In addition, the first and the second lead frames 3, 4 are arranged with an upper side facing away from the carrier 2 at the same height as the third lead frame 5. In this way, the first and the second lead frames 3, 4 are at a greater distance from the electrically conductive layer 14. An improved electrical insulation is thus obtained between the first and the second lead frames 3, 4 and the electrically conductive layer 14. Better electrical insulation is also achieved when at least a part of the first lead frame 3 and/or of the second lead frame 4 is at a greater distance from the layer 14.

In the exemplary embodiment illustrated, between the layer 14 and the first and the second lead frames 3, 4 an insulation layer 27 is arranged. The insulation layer 27 preferably forms a part of the housing 6 and is designed in particular in one piece with the remaining parts of the housing 6 and can consist, for example, of a polymer or, less preferably, of a photoresist. Depending on the selected embodiment, the insulation layer 27 can be dispensed with so that between the layer 14 and the lead frames 3, 4 a gas such as air or an evacuated region is located at least in places. A further improved electrical insulation between the first and the second lead frames 3, 4 can be achieved with the aid of the insulation layer 27 and the layer 14. The first and the second contacts 25, 26 can be formed, for example, as a contact layer. The carrier 2 can be designed, for example, as a conductor plate and/or a PCB (printed circuit board).

In addition, the layer 14, as shown schematically in FIG. 5, can also be arranged in the carrier 2. Furthermore, the layer 14 can also be arranged on an underside of the carrier 2 facing away from the device 1. In addition, a further layer 28 can be arranged in the carrier 2, said further layer being arranged parallel to the layer 14. By the provision of a further layer 28, which forms an electrically conductive connection between the first and the second contacts 25, 26, in or on the carrier 2, the electrical resistance is further reduced, as a result of which shorter switching times can be realized.

The layers 14, 28 are preferably connected via electrically conductive via contacts 29, 30 in or on side faces of the carrier 2 and are electrically conductively connected to the contacts 25, 26.

The lead frames 3, 4, 5 are produced from an electrically conductive material, in particular from copper or a copper alloy. Coatings can be present, for example for improving a solderability. The first lead frame 3 is completely etched and the second lead frame 4 is partially etched with the aid of an etching process, for example, from the mounting side 41, to a smaller thickness than the third lead frame 5. The first and the second lead frames 3, 4 can thus be produced with the aid of deep etching of a QFN lead frame.

With the aid of the described arrangement, a microstrip line is realized in the carrier 2 by means of the correspondingly shaped layer 14 and in particular its contact point for the third lead frame 5, wherein the layer 14 and/or the further layer 28 preferably represent a ground plane.

Improved electrical properties are already achieved if only the first lead frame 3 or only the second lead frame 4 has a smaller thickness and/or a greater distance to the layer 14 of the carrier 2.

Furthermore, an improvement in the electrical properties is achieved when a part of the first or of the second lead frame 3, 4 is at a greater distance from the layer 14. A reduction in the inductance is better the smaller the distance between the lead frames 3, 4 and the GND layer 14. However, the distance between the lead frames 3, 4 and the layer 14 is required in order to prevent an electrical short circuit.

The first, the second and the third lead frames 3, 4, 5 are, for example, produced in that a lead frame grid having first, second and third lead frames is manufactured from a metal part, in particular copper. In this case, at least one part of the first and/or of the second lead frame 3, 4 or the entire first and the second lead frames 3, 4 is produced with a thinner thickness, wherein the upper side of the first and of the second lead frames 3, 4 is at the same height as the upper side of the third lead frame 5.

For producing the lead frames, an etching method can be used, for example. In this case, the first and/or the second lead frame are formed thinner from the underside than the third lead frame 5, for example with a depth etching. Subsequently, the lead frames 3, 4, 5 are embedded in a molding material, for example made of plastic material for the housing 6. The capacitor 8, the component 7 and the control circuit 9 are placed on the lead frames 3, 4, 5 and, as described above, are electrically conductively connected to the lead frames. Subsequently, said arrangement is separated out of the composite. During the separation, connecting webs between the lead frames 3, 4, 5, 10, 11, 12, 13 are cut through, corresponding end faces of the lead frames 3, 4, 5, 10, 11, 12, 13 can lie freely on the outside of the housing 6, see also FIGS. 1 and 6E. The device 1 is thus obtained. The device 1 can now be electrically conductively connected to the carrier 2, as already explained above. In addition, however, the device 1 can also be supplied separately to a customer and can just be installed by the customer with the carrier 2.

With the aid of the described method, a device 1 and an arrangement having a device 1 and a carrier 2 can be produced in a simple and cost-effective manner.

Due to the one-sided stronger thinning of at least one part of the first and of the second lead frames 3, 4 or of the entire lead frames 3, 4, a device 1 is obtained in which the upper sides of the lead frames 3, 4, 5 are arranged at the same height. In this way, the capacitor 8, the control circuit 9 and the component 7 are mounted in a simple and precise manner on the lead frames 3, 4, 5. At the same time, however, at least a part of or the entire first and second lead frames 3, 4 are set back with their underside with respect to a lower side of the third lead frame 5, the lower side of which faces the carrier 2. Thus, when mounting the device 1 to the mounting side 41 on the carrier 2, an enlarged distance between the carrier 2 and at least part of the first and second lead frames 3, 4 is obtained. Hence, an arrangement having an improved electrical insulation between the layer 14 of the carrier 2 and the first and/or second lead frames 3, 4 can be provided. In addition, an insulating layer can be introduced between the carrier 2 and the thinner first and/or second lead frames, in order to improve the electrical insulation.

Depending on the selected embodiment, the device 1 can also have only two lead frames 3, 4. In this embodiment, at least a part of the underside of one of the two lead frames is set back in relation to the underside of the other lead frame. In this embodiment, too, an arrangement comprising a component and a carrier can be provided, in which the electrical insulation between one of the lead frames and an electrically conductive layer of the carrier is improved.

FIG. 6 illustrates a further exemplary embodiment of the device 1, see the plan views in FIGS. 6A and 6B, the side views in FIGS. 6C and 6D and the sub-views in FIGS. 6E and 6F. For better identification, FIGS. 6B, 6D and 6F are drawn without the housing 6. The representations in FIG. 6 are to scale, dimensional specifications are given in mm.

In this exemplary embodiment, the third lead frame 5 is the largest lead frame. In addition, five of the contact surfaces 10, 11, 12, 13 are present, wherein, in contrast to this, more or fewer contact surfaces can also be provided. Both the first and the third lead frames 3, 5 are T-shaped when viewed in plan view, wherein comparatively short-shaped middle parts of the T's each point to the other lead frame 3, 5. The second lead frame 4, which is in particular designed as ground contact GND, is located between the lead frames 3, 5.

The third lead frame 5 is thus preferably designed as a contact for the supply voltage V. Such a transposition of the contacts V, GND relative to FIG. 1 can also occur in all other exemplary embodiments.

The first lead frame 3 with the component 7 is preferably not electrically connected, but is used, for example, only as a heat sink. The third lead frame 5 separates the lead frames 3, 4 spatially from the contact surfaces 10, 11, 12, 13, seen in a plan view. The capacitor 8 is located as close as possible to the middle parts of the T's of the lead frames 3, 5. The lead frames 3, 4, 5, 10, 11, 12, 13 and the elements 7, 8, 9 are each electrically connected by means of bonding wires.

Otherwise, the statements relating to FIGS. 1, 2, 4 and 5 apply.

In FIG. 7, the electrical circuitry is sketched analogously to FIG. 3. In contrast to FIG. 3, the switching element of the control circuit 9 is electrically arranged between the component 7 and the capacitor 8. Optionally, as in FIG. 3, not shown in FIG. 7, a path for the third discharge current can be provided in the device 1, in particular in the third lead frame 5. Otherwise, the statements relating to FIG. 3 apply.

Although the invention has been illustrated and described in more detail by the preferred exemplary embodiment, the invention is not restricted by the disclosed examples and other variations can be derived from the person skilled in the art, without departing from the scope of protection of the invention.

This patent application claims the priority of German patent application 10 2016 208 431.3, the disclosure content of which is hereby incorporated by reference.

LIST OF REFERENCE SIGNS

1 device
2 carrier
22 carrier top side
40 lead frame assembly
3 first lead frame
4 second lead frame
5 third lead frame
6 housing
7 component
8 capacitor
9 control circuit
10 first contact surface
11 second contact surface
12 third contact surface
13 fourth contact surface
14 layer
15 emission direction
16 insulation layer
17 first connection of the component
18 second connection of the component
19 first connection of the control circuit
20 second connection of the control circuit
21 third connection of the control circuit
220 further connection
23 first connection of the capacitor
24 second connection of the capacitor
25 first contact
26 second contact
27 insulation layer
28 further layer
29 first via contact
30 second via contact
31 first arrow/first discharge current in the device
32 second arrow/second discharge current in the carrier 33 third arrow/third discharge current in the device
41 mounting side
100 arrangement
GND ground contact
T control voltage
V supply voltage

The invention claimed is:

1. An arrangement having a surface-mountable electrical device and having a carrier, the surface-mountable electrical device comprising
at least one electrical component which is a semiconductor component and which is intended for generating radiation,
a control circuit for pulsed operation of the component,
a capacitor which is connected to the component electrically in series and which is configured for the pulsed energization of the component, and
a lead frame assembly as a mounting platform for the component, the capacitor and the control circuit, wherein the lead frame assembly comprises a plurality of different lead frames including at least a first lead frame, a second lead frame, and a third lead frame, and at least one of the plurality of different lead frames is thinner than at least one other of the lead frames of the plurality of different lead frames so that the lead frame assembly lies only partially in a mounting side,
wherein
the device is applied to a top side of the carrier,
a contact layer having a plurality of contact points is present on the top side, and the lead frames are electrically and mechanically connected to said contact points, and
the lead frames are partially spaced apart from the top side,
wherein a first region of the third lead frame, on which the control circuit and the capacitor are arranged, is electrically connected directly to a second region of the third lead frame via the contact layer, wherein during operation of the component both connections of the capacitor are electrically connected to one another via the component, the control circuit and the contact layer such that by means of the contact layer an inductance for a discharge current out of the capacitor is decreased and a part of the discharge current flows through the contact layer.

2. The arrangement device according to claim 1, wherein
the component is mounted on the first lead frame,
the capacitor is applied to the second lead frame by means of a first connection,
the control circuit and the capacitor are connected to a second connection on the third lead frame,
the control circuit is electrically connected directly to at least one contact surface which is formed by one of the lead frames,
the component is electrically connected directly to the second lead frame and the control circuit.

3. The arrangement according to claim 2, wherein
the second lead frame serves as an external electrical contact point for a supply voltage (V) and the third lead frame is configured as an external electrical contact point for a ground contact (GND),
at least one of the contact surfaces is configured as an exposed electrical contact point for a control voltage (T) for the control circuit, and
the component lies electrically between the capacitor and the control circuit, or the control circuit lies electrically between the component and the capacitor.

4. The arrangement according to claim 2, wherein the second and the third lead frames are L-shaped when viewed in a plan view, wherein the second lead frame lies within a rectangle spanned by the third lead frame.

5. The arrangement according to claim 2, wherein the third lead frame is the largest lead frame and the first and the third lead frames are T-shaped when viewed in a plan view, so that middle parts of the two T's face each other, wherein the second lead frame is arranged between the first and the third lead frames on one side of the two middle parts of the T's when viewed in a plan view.

6. The arrangement according to claim 1, further comprising a housing, wherein the housing is made of a plastic and the housing is partially located between the lead frame assembly and the mounting side, and wherein the device is a QFN device.

7. The arrangement according to claim 1, wherein during operation of the component the two connections of the capacitor are electrically connected to one another via the component, the control circuit and the lead frame so that a part of the discharge current flows within the device.

8. The arrangement according to claim 1
wherein the contact layer-which connects the first and second regions runs completely and directly on the top side,
wherein the first lead frame is spaced apart from the mounting side and has been thinned over the whole area by a thinning process, and
wherein the second lead frame, viewed in plan view, is arranged in places above the contact layer and is spaced apart from the contact layer as a result of a point-wise thinning process.

9. An arrangement having a surface-mountable electrical device and having a carrier, the surface-mountable electrical device comprising
at least one electrical component which is a semiconductor component and which is intended for generating radiation,
a control circuit for pulsed operation of the component,
a capacitor which is connected to the component electrically in series and which is configured for the pulsed energization of the component, and
a lead frame assembly having a plurality of different lead frames as a mounting platform for the component, the capacitor and the control circuit, wherein the lead frame assembly comprises a lead frame that is thinner than at least one other lead frame of the plurality of different lead frames so that the lead frame assembly lies only partially in a mounting side,
wherein
the device is applied to a top side of the carrier,
a contact layer having a plurality of contact points is present on the top side, and the lead frames are electrically and mechanically connected to said contact points, and
the lead frames are partially spaced apart from the top side,
wherein in a plan view, a discharge current in the device through the component is congruent with the discharge current in the contact layer,
wherein a distance between the contact layer and a first lead frame of the plurality of lead frames on which the component is located is at most 1.5 mm.

10. The arrangement according to claim 1, wherein upper sides of the lead frames facing away from the mounting side are arranged at the same height.

11. The arrangement according to claim 1,
wherein a second electrically conductive layer is arranged in the carrier,
wherein the second layer is electrically conductively connected to the first layer, and
wherein the first and the second layers are arranged parallel to one another.

12. A method for producing the arrangement according to claim 1,
wherein a first and at least one further lead frame are provided,
wherein at least a part of the first lead frame is subjected to a thinning process such that the first lead frame is thinner than the at least one further lead frame so that the lead frame assembly lies only partially in the mounting side,
wherein the lead frames are embedded in a material for a housing,
wherein the capacitor, the component and the control circuit are mounted on the lead frames,
wherein an underside of a part of the first lead frame is at a greater distance from the mounting side of the device than at least one part of the at least one further lead frame, and
wherein the device is mounted on the carrier top side.

13. The method according to claim 12,
wherein the thinning process to which the first lead frame is subjected comprises a deep etch so that a thickness of the first lead frame is between 50% and 90% inclusive of a thickness of the at least one further lead frame.

* * * * *